(12) United States Patent
Yue et al.

(10) Patent No.: US 10,042,269 B2
(45) Date of Patent: Aug. 7, 2018

(54) APPARATUS AND METHOD FOR OVERLAY MEASUREMENT

(71) Applicant: Semiconductor Manufacturing International (Shanghai) Corporation, Shanghai (CN)

(72) Inventors: Liwan Yue, Shanghai (CN); Qiang Wu, Shanghai (CN); Yang Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/136,482

(22) Filed: Apr. 22, 2016

(65) Prior Publication Data

US 2016/0313655 A1 Oct. 27, 2016

(30) Foreign Application Priority Data

Apr. 23, 2015 (CN) .......................... 2015 1 0196999

(51) Int. Cl.
*G03F 7/00* (2006.01)
*G03F 7/20* (2006.01)
*G01B 9/02* (2006.01)

(52) U.S. Cl.
CPC ....... *G03F 7/70633* (2013.01); *G01B 9/0203* (2013.01); *G01B 9/02098* (2013.01); *G01B 2210/56* (2013.01)

(58) Field of Classification Search
CPC .. G01B 9/02098; G03F 7/706; G03F 7/70683; G03F 7/70633; G03F 7/70616
See application file for complete search history.

(56) References Cited

U.S. PATENT DOCUMENTS

| 2005/0286051 | A1 | 12/2005 | Sezginer et al. |
| 2007/0077503 | A1* | 4/2007 | Yoo ..................... G03F 7/70633 430/22 |
| 2008/0034344 | A1* | 2/2008 | Chiu ................... G03F 7/70633 430/5 |

FOREIGN PATENT DOCUMENTS

CN 2352975 Y 12/1999

* cited by examiner

*Primary Examiner* — Jonathan Hansen
(74) *Attorney, Agent, or Firm* — Anova Law Group, PLLC

(57) ABSTRACT

The present disclosure provides apparatus and methods for overlay measurement. An exemplary overlay measurement apparatus includes an illuminating unit, configured to generate light to illuminate a first overlay marker having a first sub-overlay marker along a first direction and a second overlay marker along a second direction; a first measuring unit, configured to receive light reflected from the first overlay marker to cause the reflected light to laterally shift and shear to generate interference light, to receive the interference light to form a first image and to determine existence of overlay offsets along the first direction and the second direction and values of the overlay offset; and a first drive unit connected to the first measuring unit, and configured to drive the first measuring unit to rotate from a first position to a second position to measure the first sub-overlay marker and the second sub-overlay marker, respectively.

19 Claims, 11 Drawing Sheets

APPARATUS AND METHOD FOR OVERLAY MEASUREMENT

CROSS-REFERENCES TO RELATED APPLICATIONS

This application claims the priority of Chinese patent application No. 201510196999.6, filed on Apr. 23, 2015, the entirety of which is incorporated herein by reference.

FIELD OF THE INVENTION

The present invention generally relates to the field of semiconductor manufacturing and, more particularly, relates to overlay measurement apparatus and overlay measurement methods thereof.

BACKGROUND

Photolithography is a major process for the fabrication of integrated circuits (ICs). A photolithography process may be used to transfer patterns on a reticle to a photoresist layer formed on a substrate.

The photolithography process is usually performed by a photolithography apparatus. The photolithography apparatus includes a wafer stage for loading a wafer; a reticle stage, disposed above the wafer stage, for loading a reticle; a light source, disposed above the reticle, for providing the exposure light; and an optical projection unit, disposed between the reticle stage and the wafer stage, for projecting the light transmitting through the reticle onto the substrate.

During the exposure process, an overlay measurement is required to determine if the current layer is aligned with the previous layer over the substrate. Such an overlay measurement is able to ensure the alignment between images formed on the current layer and images formed on the previous layer.

The existing overlay measurements include the image-based overlay (IBO) technology and the diffraction-based overlay (DBO) technology. Because the bright-field detection is easily affected by various defects on a substrate, such as the rough background on the substrate, and the deformation of the overlay marker during a chemical mechanical planarization process, etc., the IBO technology is already unable to meet the overlay measurement requirements of new technical nodes. Thus, the DBO technology is becoming one of the primary means of overlay measurement.

The DBO technology acquires overlay errors by measuring the asymmetry of the light intensity between the positive and the negative diffraction orders in the angular resolution of the diffracted light from overlay markers. Although the DBO technology is able to determine whether there is an offset during the overlay measurement, i.e., the existence of the overlay offset, it is difficult to obtain the specific value of the overlay offset. The disclosed methods and systems are directed to solve one or more problems set forth above and other problems.

BRIEF SUMMARY OF THE DISCLOSURE

One aspect of the present disclosure includes an overlay measurement apparatus. The overlay measurement apparatus includes an illuminating unit, configured to generate light to illuminate a first overlay marker having a first sub-overlay marker along a first direction and a second overlay marker along a second direction perpendicular to the first direction to generate reflected light; a first measuring unit, configured to receive the reflected light from the first overlay marker to cause the reflected light to laterally shift and shear to generate interference light, to receive the interference light to form a first image, and to determine existence of overlay offsets along the first direction and the second direction and values of the overlay offset; and a first driving unit, connected to the first measuring unit, and configured to drive the first measuring unit to rotate from a first position to a second position to measure the first sub-overlay marker along the first direction and the second sub-overlay marker along the second direction, respectively.

Another aspect of the present disclosure includes providing an overlay measurement method. The overlay measurement method includes disposing a first measuring unit at a first position; illuminating a first grating of a first overlay marker on a wafer to generate a first reflected light; forming first lateral shearing interference fringes from the first reflected light; obtaining a first offset of the first grating relative to a first optical axis according to the first lateral shearing interference fringes; illuminating a second grating of the first overlay marker to generate a second reflected light; forming second lateral shearing interference fringes from the second reflected light; obtaining a second offset of the second grating relative to the first optical axis according to the second lateral shearing interference fringes; determining existence of an overlay offset and an exact value of the overlay offset along a first direction according to a difference between the first offset and the second offset; moving the first measuring unit from the first position to a second position; illuminating a third grating of the first overlay marker to generate a third reflected light; forming third lateral shearing interference fringes from the third reflected light; obtaining a third offset of the third grating relative to the first optical axis according to the third lateral shearing interference fringes; illuminating a fourth grating of the first overlay marker to generate a fourth reflected light; forming fourth lateral shearing interference fringes from the fourth reflected light; obtaining a fourth offset of the fourth grating relative to the first optical axis according to the fourth lateral shearing interference fringes; and determining existence of an overlay offset and an exact value of the overlay offset along a second direction perpendicular to the first direction according to a difference between the third offset and the fourth offset.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
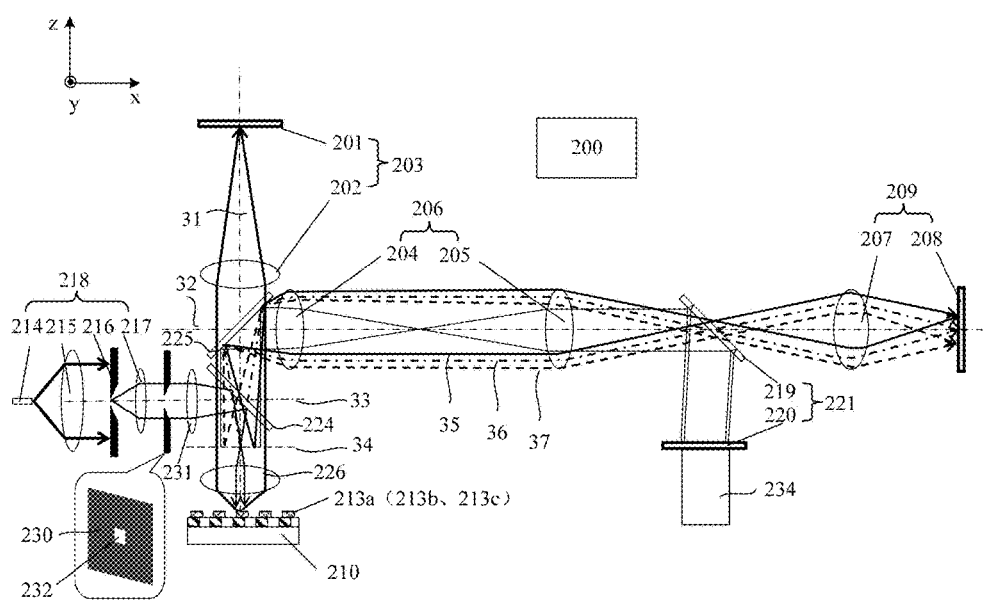
FIGS. 1-4 illustrate an exemplary overlay measurement apparatus according to the disclosed embodiments.
Figure 2:
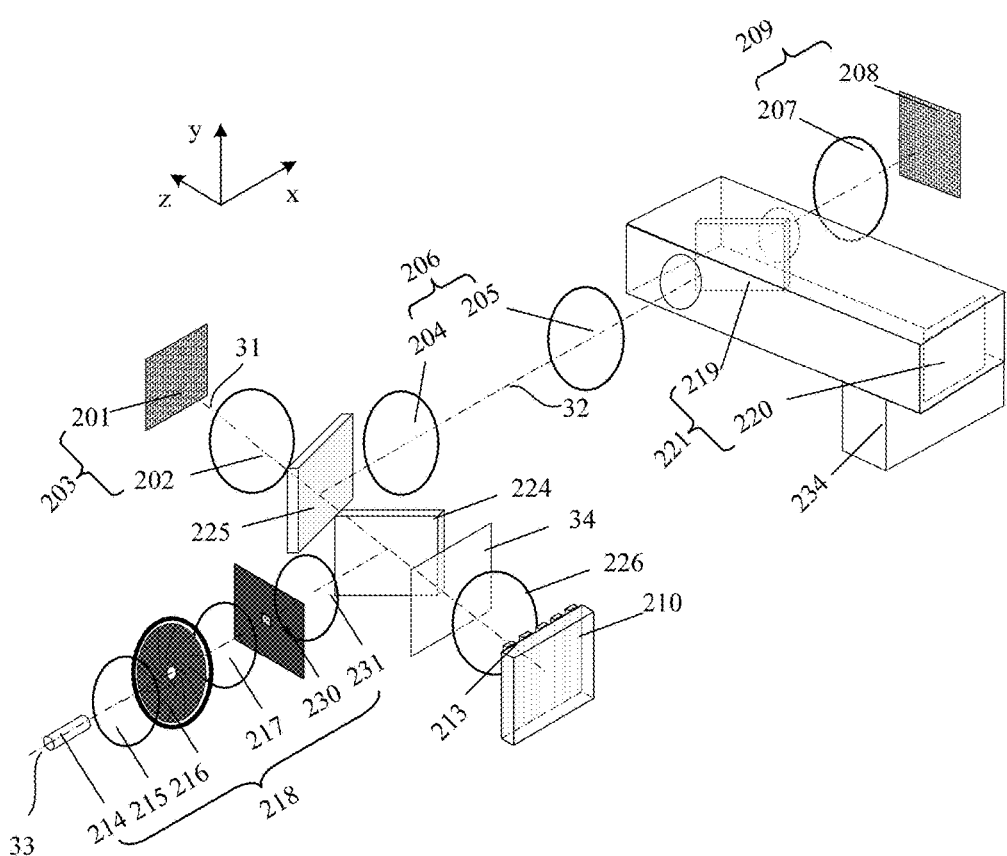
Figure 3:
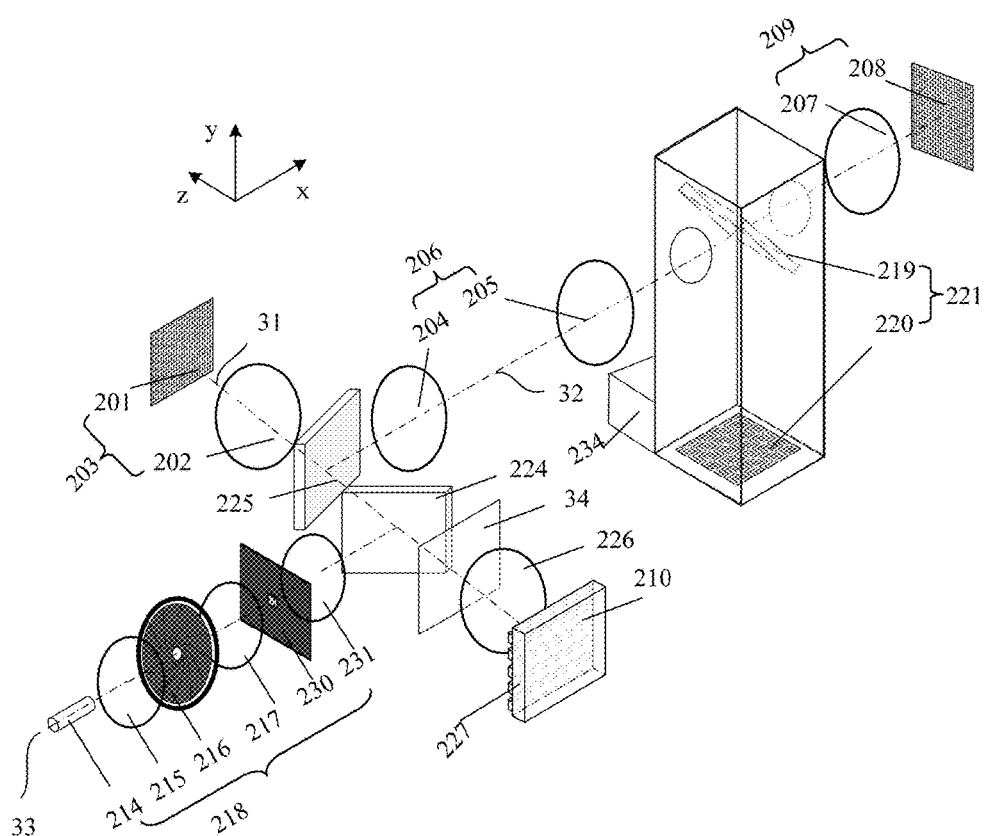

FIGS. 1-4 illustrate an exemplary overlay measurement apparatus consistent with the disclosed embodiments. As illustrated in FIGS. 1-3, the overlay measurement apparatus includes a main control unit 200 and an illuminating unit 218.

The main control unit 200 may control the operation of the overlay measurement apparatus including, sending and receiving control signals, data processing, and display of related data, etc. The main control unit 200 may include a computer, and related circuits, etc.

The illuminating unit 218 may generate light to illuminate the first overlay marker 213a, the second overlay marker 213b and/or the third overlay marker 213c formed on a wafer 210. For example, reflected light may be generated when the first overlay marker 213a and the second overlay marker 213b are illuminated. Positive and negative diffracted light may be generated when the third overlay marker 213c is illuminated.

Referring to FIG. 2 and FIG. 3, the first overlay marker 213a may include a first sub-overlay marker 213 along a first direction; and a second sub-overlay marker 227 along the second direction. The first direction may be perpendicular to the second direction.

Further, the overlay measurement apparatus also include a first measuring unit 221. The first measuring unit 221 may be configured to receive the reflected light from the first sub-overlay marker 213 along the first direction, or the reflected light from the second sub-overlay marker 227 along the second direction. The first measure unit 221 may also cause the received reflected light to generate lateral shifting and shearing interference to form an interference light; and may receive the interference light to form a first image. Thus, the existence of an overly offset along the first direction, or the existence of an overlay offset along the second direction may be determined according to the first image. Accordingly, the specific values of the overlay offset may also be obtained.

Further, the overlay measurement apparatus may also include a first driving unit 234. The first drive unit 234 may be connected to the first measuring unit 221. The first driving unit 234 may drive the first measuring unit 221 to rotate from a first position to a second position such that the first measure unit 221 may measure the first sub-overlay marker 213 along the first direction and the second sub-overlay marker 227 along the second direction on the wafer 210, respectively.

Further, the overlay measurement apparatus may also include a second measuring unit 203. The second measuring unit 203 may be configured to receive the reflected light generated on the second overlay marker 213b to form a second image. According to the second image, whether there is an overlay offset may be determined.

Further, the overlay measurement apparatus may also include a third measuring unit 209. The third measure unit 209 may be configured to receive the positive and negative diffracted light generated on the third overlay marker 213c to form a third image. According to the third image, whether there is an overlay offset may be determined.

Further, the overlay measurement apparatus may also include a first optical axis 31, a second optical axis 32, and a first imaging lens 226. The second optical axis 32 may be perpendicular to the first axis 31; and may cross with the first optical axis 31.

Further, the overlay measurement apparatus may also include a first beam-splitting plate 224 and a second beam-splitting plate 225. The first beam-splitting plate 224 may be disposed on the first optical axis 31. The first beam-splitting plate 224 may have a first surface and a second surface opposing the first surface. The second beam-splitting plate 225 may be disposed at the intersection point of the first optical axis 31 and the second axis 32. The first imaging lens 226 may be disposed on the first optical axis 31 below the first surface of the first beam-splitting plate 224. The second beam-splitting plate 225 may have a third surface and a fourth surface opposing the third surface. The angle between the first beam-splitting plate 224 and the first optical axis 31 may be approximately 45°; and the angle between the second beam-splitting plate 225 and the extension line of the first beam-splitting plate 224 may be approximately 90°.

Moreover, the first beam-splitting plate 224 may be disposed on the first optical axis 31 of the side of the second beam-splitting plate 225 far away from the second measuring unit 203. The third surface of the second beam-splitting plate 225 may face the second surface of the first beam-splitting plate 224.

As shown in FIG. 1, in one embodiment, the first optical axis 31 may be in "z" axis; and the second optical axis 32 may be in "x" axis. In certain other embodiments, the first optical axis 31 and the second optical axis 32 may align with other coordinate directions.

The first beam-splitting plate 224 and the second beam-splitting plate 225 may be configured to change the light transmission direction on the optical path. A portion of the light may continue to transmit after transmitting through the first beam-splitting plate 224 and the second beam-splitting plate 225; and a portion of the light may continue to transmit after being reflected on the first beam-splitting plate 224 and the second beam-splitting plate 225.

The second measuring unit 203 may be disposed on the first optical axis 31 of the side of the fourth surface of the second beam-splitting plate 225. A portion of the reflected light may be received by the second measuring unit 203 after transmitting through the first beam-splitting plate 224 and the second beam-splitting plate 225.

Further, the second measuring unit 203 may include a second imaging lens 202 and an image-based imaging unit 201. The second imaging lens 202 may be disposed on the first optical axis 31 at the side of the fourth surface of the second beam-splitting plate 225, for example, above the fourth surface of the second beam-splitting plate 225. The image-based imaging unit 201 may be disposed on the first optical axis 31 at the side of the second imaging lens 202 far away from the second beam-splitting plate 225. The second imaging lens 202 may focus the portion of the reflected light transmitting through the second beam-splitting plate 225 on the image-based imaging unit 201. The image-based imaging unit 201 may then receive the reflected light converged by the second imaging lens 202 to form a second image; and to determine whether there is an overlay offset according to the second image.

During the overlay measurement of the second overlay marker, the image-based imaging unit 201 may receive the reflected light from the overlay marker to form the image directly. That is, the real image of the second overlay maker may be formed on the image-based imaging unit 201. The image-based imaging unit 201 may include CMOS or CCD image sensors, etc.

The third measuring unit 209 may be disposed on the second optical axis 32 at the side of the third surface of the second beam-splitting plate 225. During the overlay measurement, a portion of the positive and negative diffracted light generated by the third overlay marker 213c may be received by the third measuring unit 209 after transmitting through the first beam-splitting plate 224 and being reflected by the third surface of the second beam-splitting plate 225.

Further, a relay lens unit 206 may be disposed on the second optical axis 32 between the third measuring unit 209 and the second beam-splitting plate 225. The relay lens unit 206 may include a first relay lens 204 and a second relay lens 205. The distance between the first relay lens 204 and the second beam-splitting plate 225 may be shorter than the distance between the second relay lens 205 and the second beam-splitting plate 225. Moreover, the first relay lens 204 and the second relay lens 205 may share a same focus point.

The third measuring unit 209 may include a third imaging lens 207 and a diffraction-based imaging unit 208. The third imaging lens 207 may be disposed on the second optical axis 32 at the side of the relay lens unit 206 far away from the second beam-splitting plate 225. The diffraction-based imaging unit 208 may be disposed on the second optical axis 32 at the side of the third imaging lens 207 far away from the second beam-splitting plate 225. The third imaging lens 207 may converge the positive and negative diffracted light onto the diffraction-based imaging unit 208 after transmitting through the relay lens unit 206. The diffraction-based imaging unit 208 may receive a portion of the positive and negative diffracted light to form a third image after transmitting through the third imaging lens 207; and may determine whether there is an overlay offset according to the third image.

The first measuring unit 221 may be disposed between the relay lens unit 206 and the third measuring unit 209. The first measuring unit 221 may include a transparent beam-splitting plate 219 and an interferometer imaging unit 220. The transparent beam-splitting plate 219 may be disposed on the second optical axis 32 between the relay lens unit 206 and the third measuring unit 209. The transparent beam-splitting plate 219 may include a fifth surface and a sixth surface opposing the fifth surface. Moreover, the fifth surface of the transparent beam-splitting plate 219 may face the third surface of the second beam-splitting plate 225. The angle between the transparent beam-splitting plate 219 and the second optical axis 32 may be approximately 45°; and the angle between the transparent beam-splitting plate 219 and the extension line of the second beam-splitting plate 225 may be approximately 90°. The interferometer imaging unit 220 may be disposed below the fifth surface of the transparent beam-splitting plate 219.

A portion of the reflected light (generated on the first overlay marker 213a) may be reflected on the fifth surface and the sixth surface of the transparent beam-splitting plate 219 after transmitting through the relay lens unit 206. An interference may occur between two sets of reflected light from the fifth surface and the sixth surface; and may be received by the interferometer imaging unit 220 to generate the first image. According to the first image, the existence of an overlay offset may be determined; and the specific value of the overlay offset may also be determined.

The transparent beam-splitting plate 219 may be a transparent beam-splitting plate with a wedged angle. That is, there may be a wedged angle between the fifth surface and the sixth surface of the transparent beam-splitting plate 219. During the measurement, after transmitting through the second beam-splitting plate 225 and the relay lens unit 206, the light reflected by the overlay marker may be further reflected on the fifth surface and the sixth surface of the transparent beam-splitting plate 219 with the wedged angle. Such a light may be divided into two light waves with an identical amplitude and with a space shift. The two light waves may superimpose (or interfere) with each other; and may be received by the interferometer imaging unit 220. In one embodiment, the wedged angle may be in a range of approximately 1°-5°. Specifically, the wedged angle may be approximately 2°.

The first measuring unit 221 may be connected to the first driving unit 234. The first driving unit 234 may drive the first measuring unit 221 to rotate from a first position to a second position. The first sub-overlay marker 213 along the first direction and the second sub-overlay marker 227 along the second direction formed on the wafer 210 may be measured by the first measuring unit 221, respectively. Specifically, when the first sub-overlay marker 213 is at the first position, the first sub-overlay marker 213 along the first direction may be measured by the first measuring unit 221. When the second sub-overlay marker 227 is at the second position, the second sub-overlay marker 227 along the second direction may be measured by the first measuring unit 221.

Referring to FIGS. 2-3, the rotation process of the first measuring unit 221 from the first position to the second position may include driving the first measuring unit 221 to rotate for 90° from the first position around the second optical axis 32 to the second position using the first driving unit 234. The second optical axis 32 may be used as the central rotating axis. During the rotation process, the relative position between the transparent beam-splitting place 219 and the interferometer imaging unit 220 may remain the same.

Further, the overlay measurement apparatus may also include a third optical axis 33. The third optical axis 33 may be intersected perpendicularly with the first optical axis 31. The first beam-splitting plate 224 may be disposed at the intersection point of the first optical axis 31 and the third optical axis 33. The illuminating unit 218 may be disposed on the third optical axis 33 at the side of the first surface of the first beam-splitting plate 224. The illuminating light generated from the illuminating unit 218 may be reflected by the first surface of the first beam-splitting plate 224; and then converged by the first imaging lens 226 to illuminate the first overlay marker 213a, the second overlay marker 213b and/or the third overlay marker 213c. In one embodiment, the third optical axis 33 may be in parallel to the "x" axis. In certain other embodiments, the third optical axis 33 may be aligned with other coordinate directions.

The illuminating unit 218 may include a light source 214, a beam expander lens 215, a first aperture 216 and a first condensing lens 217 sequentially disposed on the third optical axis 33. The illuminating unit 218 may also be referred to provide a Köhler illumination. The light source 214 may generate a point light source. The beam expander lens 215 may convert the point light source to parallel light. The first aperture 216 may restrict the light beam. The first condensing lens 217 may convert the light transmitting through the first aperture 216 to parallel light.

The illuminating unit 218 may also include a second driving unit (not shown), a second aperture 230 and a second condensing lens 231. The second aperture 230 may be disposed between the first condensing lens 217 and the first beam-splitting plate 224. The second condensing lens 231 may be disposed between the second aperture 230 and the first beam-splitting plate 224. The second aperture 230 may restrict the size of the light beam transmitting through the first condensing lens 217. The second condensing lens 231 may converge the light on the first surface of the first beam-splitting plate 224 after transmitting through the second aperture 230, and then focus the converged light on the back focal plane 34 of the first imaging lens 226. The second driving unit may be connected to the second aperture 230 to drive the second aperture 230 to move along the direction perpendicular to the third optical axis 33. Thus, the incident direction of the light transmitting through the second aperture 230 may be changed.

In one embodiment, the second aperture 230 may include a shielding layer (not labeled) and a square hole 232 in the shielding layer. After transmitting through the first condensing lens 217, the light beam may be restricted by the second aperture 230; and continue to transmit only through the square hole 232 in the second aperture 230. The second aperture 230 may be at different locations under the driving of the second driving unit. Therefore, the location of the incident light on the surface of the second condensing lens 231 after transmitting through the second aperture 230 may change, as well as the incident angle of the light beam on the first surface of the first beam-splitting plate 224 after being converged by the second condensing lens 231. As a result, the light beam may illuminate different regions of the wafer 210 after being reflected by the first surface of the first beam-splitting plate 224.

In one embodiment, the second aperture 230 may be connected to the second driving unit. The second driving unit may drive the second aperture 230 to move up and down (such as the positive and the negative directions of the "z" axis) and left and right (such as the positive and negative directions of the "y" axis) along the direction perpendicular to the third optical axis 33. By moving the second aperture 230, the illuminating light generated by the illuminating unit 218 may sequentially illuminate a first grating and a second grating of the first sub-overlay marker 213 along the first direction (or the third grating and the fourth grating of the second sub-overlay marker 227 along the second direction). Thus, the reflected light from the first grating and the second grating may undergo lateral shifting and shearing, and then be sequentially received by the first measuring unit 221. By measuring the intensity of the light after lateral shifting and shearing interference with the first measuring unit 221, the first offset of the first grating of the first sub-overlay marker 213 along the first direction relative to the first optical axis 31 may be obtained, as well as the second offset of the second grating of the first sub-overlay marker 213 along the first direction relative to the first optical axis 31. The difference of the first offset and the second offset may be used to determine whether there is an overlay offset along the first direction, and the specific value of such an overly offset. Thus, it may not require the wafer 210 to move during the overlay measurement, the error caused by the movement of the wafer 210 may be minimized; and the accuracy of the overlay measurement may be improved.

Figure 4:
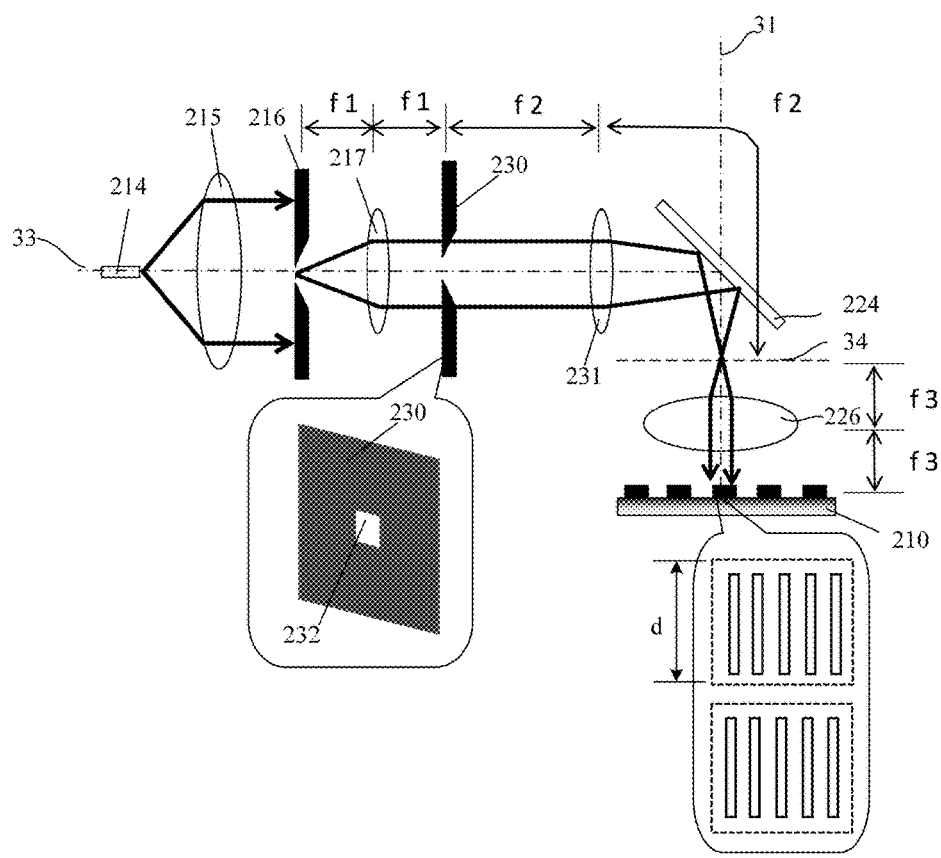
Figure 5:
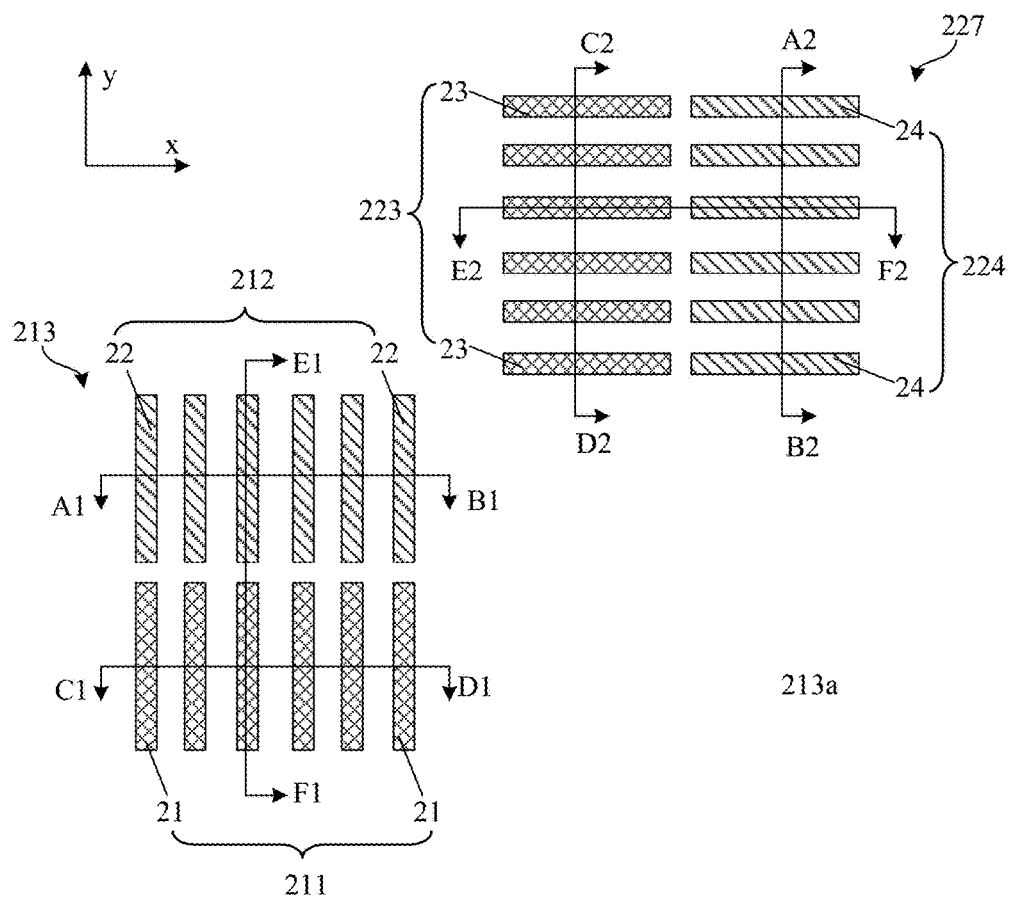
FIGS. 5-12 illustrate exemplary structures of overlay markers consistent with the disclosed embodiments.

In one embodiment, as illustrated in FIG. 4, the first focal length of the first condensing lens 217 may be referred to as "f1"; and the second focal length of the second condensing lens 231 may referred to as "f2". The first imaging lens 226 may have a third focal length "f3". The distance between the first aperture 216 and the first condensing lens 217 may be equal to "f1". The distance between the second aperture 230 and the first condensing lens 217 may be equal to "f1", and the distance between the second aperture 230 and the second condensing lens 231 may be equal to "f2". That is, the second aperture 230 may be disposed on the back focal plane of the first condensing lens 217 and the front focal plane of the second condensing lens 224. The sum of the distance between the second condensing lens 231 and the first beam-splitting plate 224 and the distance between the first beam-splitting plate 224 and the back focal plane 34 of the first imaging lens 226 may be equal to "f2". The side length of the first grating or the second grating of the first sub-overlay marker 213 along the first direction may be equal to "d". For illustrative purposes, the area in the dashed line indicates the area occupied by the first grating or the second grating. In one embodiment, to achieve the separate illumination of the illuminating unit 218 to the first grating and the second grating of the first sub-overlay marker 213 along the first direction (also the third grating and the fourth grating of the second sub-overlay marker 217 along the second direction), during the overlay measurement, the side length "L" of the square hole 232 on the second aperture 230 may need to satisfy the following equation:

$$L=(d+n)\times(f2/f3)$$

Where "n" may be in a range of approximately 2 μm-5 μm.

Further, as illustrated in FIGS. 1-3, the overlay measurement apparatus may also include a pupil plane (or a Fourier plane) 34. The pupil plane (or the Fourier plane) 34 may be a virtual plane, and may be disposed between the first beam-splitting plate 224 and the first imaging lens 226; and may correspond to the back focal plane 34 of the first imaging lens 226. The light reflected by the third overlay marker 213c may be divided to a plurality of diffraction orders on the pupil plane (or the Fourier plane) 34, such as the 0th order, and the +1th and the −1th orders that are symmetrically distributed around 0 order. The third measuring unit 209 may receive the diffracted light from the +1th, the 0th and the −1th orders to generate a third image. In one embodiment, for illustrative purposes, as shown in FIG. 1, the dotted line "37" may indicate the +1th order diffracted light; the dotted line "36" may indicate the 0th order diffracted light; and the dotted line "35' may indicate the −1th order diffracted light. In certain other embodiments, the number of diffraction orders may be more than two.

Further, as shown in FIGS. 1-3, the first overlay marker 213a, the second overlay marker 213b and the third overlay marker 213c may be formed on the wafer 210 at different locations. In a practical application process, one or more of the first overlay marker 213a, the second overlay marker 213b and the third overlay marker 213c may be formed on the wafer 210 as needed. The overlay measurement apparatus may measure the first overlay marker 213a, the second overlay marker 213b and the third overlay marker 213c formed on the wafer 210 respectively to obtain the corresponding overlay accuracy and the corresponding overlay offset.

In certain other embodiments, the second measuring unit or the third measuring unit may not be integrated in the overlay measurement apparatus. That is, the overlay measurement apparatus may only include the first measuring unit. The overlay measurement apparatus may include an illuminating unit to generate an illuminating light. The first overlay marker formed on the wafer may be illuminated; and the reflected light may then be generated. The first overlay marker may include the first sub-overlay marker along the first direction and the second sub-overlay marker along the second direction. The first direction may be perpendicular to the second direction. The first measuring unit may receive the reflected light from the first sub-overlay marker along the first direction or the second sub-overlay marker along the second direction. The received reflected light may undergo lateral shifting and shearing to form interference light. The interference light may be received to form a first image. The first image may be used to determine whether there is an overlay offset along the first direction or along the second direction, and the specific value of the overlay offset. The first driving unit, connected to the first measuring unit, may drive the first measuring unit to rotate from the first position to the second position. The first sub-overlay marker along the first direction and the second sub-overlay marker along the second direction of the wafer may be measured, respectively.

Further, the overlay measurement apparatus may also include a first optical axis and a second optical axis. The second optical axis may perpendicularly intersect with the first optical axis.

Further, the overlay measurement apparatus may also include a first beam-splitting plate. The first beam-splitting plate may be disposed on the first optical axis; and may have a first surface and a second surface opposing the first surface.

Further, the overlay measurement apparatus may also include a second beam-splitting plate. The second beam-splitting plate may be disposed at the intersection point of the first optical axis and the second optical axis. The second beam-splitting plate may have a third surface and a fourth surface opposing the third surface. The angle between the first beam-splitting plate and the first optical axis may be approximately 45°. The angle between the second beam-splitting plate and the extension line of the first beam-splitting plate may be approximately 90°. Moreover, the third surface of the second beam-splitting plate may face the second surface of the first beam-splitting plate.

The second optical axis at the side of the third surface of the second beam-splitting plate may also include a relay lens unit. The relay lens unit may include a first relay lens and a second relay lens. The distance between the first relay lens and the second beam-splitting plate may be shorter than the distance between the second relay lens and the second beam-splitting plate. Moreover, the first relay lens and the second relay lens may share a same focus point.

The first measuring unit may be disposed at the side of the second optical lens of the relay lens unit far away from the second beam-splitting plate. The first measuring unit may include a transparent beam-splitting plate and an interferometer imaging unit. The transparent beam-splitting plate, disposed on the second optical axis between the relay lens unit and the third measuring unit, may include a fifth surface and a sixth surface opposing the fifth surface. The fifth surface of the transparent beam-splitting plate may face the third surface of the second beam-splitting plate. The angle between the transparent beam-splitting plate and the extension line of the second beam-splitting plate may be approximately 90°. The interferometer imaging unit may be disposed below the fifth surface of the transparent beam-splitting plate.

The process of the first driving unit driving the first measuring unit to rotate from the first position to the second position may include driving the first measuring unit to rotate for 90° around the second optical axis to the second position using the first driving unit. The second optical axis may be used as the central axis.

The first measuring unit may also include a third driving unit. The third driving unit may be connected to the interferometer imaging unit to drive the interferometer imaging unit to move away from, or close to the fifth surface of the transparent beam-splitting plate.

Further, the overlay measurement apparatus may also include a third optical axis and a first imaging lens. The third optical axis may intersect perpendicularly with the first optical axis. The first beam-splitting plate may be disposed at the intersection point of the first optical axis and the third optical axis. The illuminating unit may be disposed on the third optical axis at the side of the first surface of the first beam-splitting plate. The first imaging lens may be disposed on the first optical axis under the first surface of the first beam-splitting plate. The illuminating light generated from the illuminating unit may be reflected by the first surface of the first beam-splitting plate; and may pass through the first imaging lens to illuminate the first overlay marker.

The illuminating unit may include a light source, a beam expander lens, a first aperture and a first condensing lens sequentially disposed on the third optical axis. The light source may generate a point light source. The beam expander lens may convert the point light source to parallel light. The first aperture may restrict the light beam. The first condensing lens may convert the light transmitting through the first aperture to the parallel light.

The illuminating unit may also include a second driving unit, a second aperture and a second condensing lens. The second aperture may be disposed between the first condensing lens and the first beam-splitting plate. The second condensing lens may be disposed between the second aperture and the first beam-splitting plate. The second aperture may restrict the size of the light beam transmitting through the first condensing lens. The second condensing lens may converge the light on the first surface of the first beam-splitting plate transmitting through the second aperture; and then focus on the back focal plane of the first imaging lens. The second driving unit may be connected to the second aperture to drive the second aperture to change the incident direction of the light after transmitting through the second aperture.

There may be a wedged angle between the fifth surface and the sixth surface of the transparent beam-splitting plate. During the overlay measurement, the first measuring unit may be at a first position. The illuminating unit may first illuminate the first sub-overlay marker along the first direction. The light may be reflected on the third surface of the second beam-splitting plate after transmitting through the first imaging lens and the first beam-splitting plate. The light may then be further reflected on the fifth surface and the sixth surface of the transparent beam-splitting plate after transmitting through the relay lens. The reflected light from the fifth surface and the sixth surface of the transparent beam-splitting plate may undergo lateral shifting and shearing to form interference light. The interference light may be received to form a first image. The first image may be used to determine whether there is an overlay offset along the first direction, and the specific value of the overlay offset by the first measuring unit. The first measuring unit may rotate from the first position to the second position; and the illuminating unit may then illuminate the second sub-overlay marker along the second direction. The reflected light from the first sub-overlay marker along the second direction may be reflected on the third surface of the second beam-splitting plate after transmitting through the first imaging lens and the first beam-splitting plate. The light may then be further reflected on the fifth surface and the sixth surface of the transparent beam-splitting plate after transmitting through the relay lens. The reflected light from the fifth surface and the sixth surface of the transparent beam-splitting plate may undergo lateral shifting and shearing to form interference light. The interference light may be received to form a first image. The first image may be used to determine whether there is an overlay offset along the second direction, and the specific value of the overlay offset by the first measuring unit.

Figure 6:
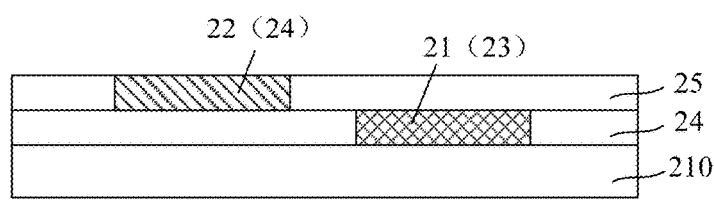
Figure 7:
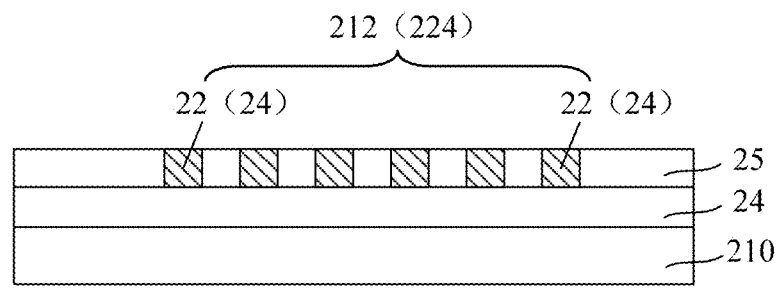
Figure 8:
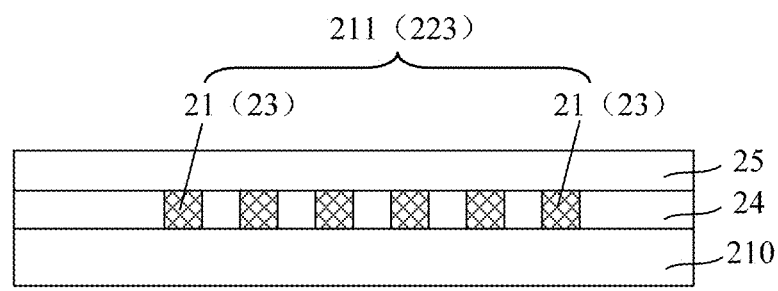

FIGS. 5-8 illustrate an exemplary first overlay marker 213*a* consistent with the disclosed embodiments. FIG. 6 illustrates a cross-sectional view of the structure illustrated in FIG. 5 along the line "E1F1" or "E2F2"; FIG. 7 illustrates a cross-sectional view of the structure illustrated in FIG. 5 along the line "A1B1" or "A2B2'; and FIG. 8 illustrates a cross-sectional view of the structure illustrated in FIG. 5 along the line "C1D1" or "C2D2".

As shown in FIGS. 5-8, the first overlay marker 213a may be a grating type of overlay marker. In one embodiment, the first overlay marker 213a may include a first sub-overlay marker 213 along a first direction; and a second sub-overlay marker 227 along a second direction. The first sub-overlay marker 213 along the first direction may be used to measure the overlay offset along the first direction; and the second sub-overlay marker 227 along the second direction may be used to measure the overlay offset along the second direction. In one embodiment, the direction in parallel to the "y" axis may be referred as the first direction; and the direction in parallel to the "x" axis may be referred as the second direction. In certain other embodiments, the first direction and the second direction may be other coordinate directions. The first sub-overlay marker 213 along the first direction and the second sub-overlay marker 227 along the second direction may be both the grating type of overlay makers.

The first sub-overlay marker 213 along the first direction may include a first grating 212 disposed in the bottom dielectric layer; and a second grating 211 disposed on the top dielectric layer. The top dielectric layer may be formed on the surface of the bottom dielectric layer. The second grating 212 may be disposed on the inclined top of the first grating 211.

In one embodiment, the first grating 211 may be disposed in the first dielectric layer 24 formed on the top surface of the wafer 210. The second grating 212 may be disposed in the second dielectric layer 25 formed on the first dielectric layer 24. The second grating 212 may be disposed on the inclined top of the first grating 211.

The first grating 211 may include a plurality of first grating stripes 21 along the first direction. There may be a slit between two adjacent first grating stripes 21. The second grating 212 may include a plurality of second grating stripes 22 along the first direction. There may be a slit between two adjacent second grating stripes 22. In one embodiment, the number and the arrangement direction of the first grating stripes 21 and the second grating stripes 22 may be the same.

The second sub-overlay marker 227 along the second direction may include a third grating 223 disposed in the bottom dielectric layer; and a fourth grating 224 disposed in the top dielectric layer. The fourth grating 224 may be disposed in the inclined top of the third grating 223.

In one embodiment, the third grating 223 may be disposed in the first dielectric layer 24 formed on the top surface of the wafer 210. The fourth grating 224 may be disposed in the second dielectric layer 25 formed on the first dielectric layer 24. The fourth grating 224 may be disposed on the inclined top of the third grating 223.

The third grating 223 may include a plurality of third grating stripes 23 along the second direction. There may be a slit between two adjacent third grating stripes 23. The fourth grating 224 may include a plurality of fourth grating stripes 24 along the second direction. There may be a slit between two adjacent fourth grating stripes 24. The first direction for the arrangement of the first grating stripes 21 and the second grating stripes 22 may be perpendicular to the second direction for the arrangement of the third grating stripes 23 and the fourth grating stripes 24.

In one embodiment, the formation of the first sub-overlay marker 213 and the second sub-over layer marker 227 may include forming the first dielectric layer 24 on the wafer 210; forming the first grating 211 and the third grating 223 in the first dielectric layer 24; forming the second dielectric layer 25 to cover the first dielectric layer 24, the third grating 223 and the first grating 211; and forming the second grating 212 and the fourth grating 224 in the second dielectric layer 25.

During the overlay measurement of the first overlay marker 213a, the wafer 210 with the first overlay marker 213a may be placed on the stage of the overlay measurement apparatus. Then, the overlay measurement apparatus may perform a wafer alignment process to establish a relative position between the wafer 210 and the stage.

In one embodiment, when the overlay measurement of the first sub-overlay marker 213 along the first direction is performed, the first optical axis 31 of the overlay measurement apparatus may be intersected perpendicularly with the central axis of the first grating 211 of the first sub-overlay marker 213 along the first direction. When the overlay measurement of the second sub-overlay marker 227 along the second direction is performed, the first optical axis 31 of the overlay measurement apparatus may be parallel to the central axis of the third grating 223 (or the fourth grating 224) of the second sub-overlay marker 227 along the second direction.

The first image formed by the first measuring unit 221 may include first transverse shearing interference fringes and second transverse shearing interference fringes, or third transverse shearing interference fringes and fourth transverse shearing interference fringes. The process to determine whether there is an overlay offset by the first measuring unit 221 may include illuminating the first sub-overlay marker 213 along the first direction using the illuminating unit 218. More specifically, the illuminating unit 218 may sequentially illuminate the first grating 211 and the second grating 212 of the first sub-overlay marker 213 along the first direction. A portion of the first reflected light generated by the first grating 211 may be received by the interferometer imaging unit 220 of the first measuring unit 221. The received first reflected light may undergo lateral shearing and interference to generate the first transverse shearing interference fringes. Further, a portion of the second reflected light generated by the second grating 212 may be received by the interferometer imaging unit 220 of the first measuring unit 221. The received second reflected light may undergo lateral shearing and interference to generate the second transverse shearing interference fringes.

Thus, the first offset and the second offset may be obtained through the first transverse shearing interference fringes and the second transverse shearing interference fringes by the first measuring unit 221, respectively. The difference between the first offset and the second offset may be used to determine whether there is an overly offset along the first direction, and the specific value of the overlay offset.

Then, the illuminating unit 218 may illuminate the second sub-overlay marker 227 along the second direction. More specifically, the illuminating unit 218 may sequentially illuminate the third grating 223 and the fourth grating 224 of the second sub-overlay marker 227 along the second direction. A portion of the third reflected light formed by the third grating 223 may be received by the interferometer imaging unit 220 of the first measuring unit 221. The received third reflected light may undergo lateral shearing and interference to generate the third transverse shearing interference fringes. A portion of the fourth reflected light generated from the fourth grating 224 may be received by the interferometer imaging unit 220 of the first measuring unit 221. The received fourth reflected light may undergo lateral shearing and interference to generate the fourth transverse shearing interference fringes. A third offset and a fourth offset may be obtained through the third transverse shearing interference fringes and the fourth transverse shearing interference fringes by the first measuring unit 221, respectively. The difference between the third offset and the fourth offset may be used to determine whether there is an overlay offset along the second direction, and the specific value of the overlay offset.

During the overlay measurement, the illuminating unit 218 may sequentially illuminate the first grating 211 and the second grating 212 of the first sub-overlay marker 213 along the first direction by two methods. In one method, the illuminating unit 218 may illuminate the first grating 211 of the first sub-overlay marker 213 along the first direction first; and followed by illuminating the second grating 212 of the first sub-overlay marker 213 along the first direction. In the other method, the illuminating unit 218 may illuminate the second grating 212 of the first sub-overlay marker 213 along the first direction first; and followed by illuminating the first grating 211 of the first sub-overlay marker 213 along the first direction. In a similar way, the illuminating unit 218 may sequentially illuminate the third grating 223 and the fourth grating 224 of the second sub-overlay marker 227 along the second direction by the two methods.

Figure 16:
FIG. 16 illustrates an exemplary overlay measurement method consistent with the disclosed embodiments.

Taking sequentially illuminating the first grating 211 of the first sub-overlay marker 213 along the first direction, the second grating 212 of the first sub-overlay marker 213 along the first direction, the third grating 223 of the second sub-overlay marker 227 along the second direction and the fourth grating 224 of the sub-overlay marker 227 along the second direction as an example to explain the process of the overlay measurement, an overlay measurement process is illustrated in FIG. 16. As shown in FIG. 16, the overlay measurement process may include disposing a first measuring unit at a first position (S101); illuminating a first grating of a first overlay marker on a wafer to generate first reflected light (S102); forming first lateral shearing interference fringes from the first reflected light (S103); obtaining a first offset of the first grating relative to a first optical axis using an interference imaging unit of the first measuring unit according to the first lateral shearing interference fringes (S104); illuminating a second grating of the first overlay marker to generate second reflected light (S105); forming second lateral shearing interference fringes from the second reflected light (S106); obtaining a second offset of the second grating relative to the first optical axis using the interference imaging unit of the first measuring unit according to the second lateral shearing interference fringes (S107); determining the existence of an overlay offset and an exact value of the overlay offset along a first direction according to a difference between the first offset and the second offset (S108); moving the first measuring unit from the first position to a second position (S109); illuminating a third grating of the first overlay marker to generate third reflected light (S110); forming third lateral shearing interference fringes from the third reflected light (111); obtaining a third offset of the third grating relative to the first optical axis using the interference imaging unit of the first measuring unit according to the third lateral shearing interference fringes (S112); illuminating a fourth grating of the first overlay marker to generate fourth reflected light (S113); forming fourth lateral shearing interference fringes from the fourth reflected light (S114); obtaining a fourth offset of the fourth grating relative to the first optical axis using the interference imaging unit of the first measuring unit according to the fourth lateral shearing interference fringes (S115); and determining existence of an overlay offset and an exact value of the overlay offset along a second direction according to a difference between the third offset and the fourth offset (S116).

Specifically, at the beginning of the overlay measurement process, the first measuring unit 221 may be disposed at a first position; and the wafer 210 with the first sub-overlay marker 213a may be placed on the wafer stage of the overlay measurement apparatus. After aligning the wafer 210 with the overlay measurement apparatus, the first sub-overlay marker 213 along the first direction may be disposed in the viewing field of the optical system (the corresponding focal plane of the first imaging lens 226) of the overlay measurement apparatus; and the illuminating unit 218 may illuminate the first grating 211 of the first sub-overlay marker 213 along the first direction to generate first reflected light. The first reflected light generated by the first grating 211 may pass through the first imaging lens 226; and may become the parallel first reflected light. The parallel first reflected light may pass through the first beam-splitting plate 224; and may be reflected on the third surface of the second beam-splitting plate 225. The reflected light may then pass through the relay lens unit 206; and arrive at the transparent beam-splitting plate 219. After being reflected at the fifth surface and the sixth surface of the transparent beam-splitting plate 219, the first transverse shearing interference fringes may be generated. The corresponding first transverse shearing interference fringes may be detected by the diffraction-based imaging unit 208 in the first measuring unit 221; and the first offset of the first grating 211 relative to the first optical axis 31 may be obtained. Then, the second aperture 230 in the illuminating unit 218 may move; and the light from the illuminating unit 218 may illuminate the second grating 212 of the first sub-overlay marker 213 along the first direction. The second reflected light, generated from the second grating 212, may pass through the first imaging lens 226; and become the parallel second reflected light. The parallel second reflected light may pass through the first beam-splitting plate 224; and may be reflected on the third surface of the second beam-splitting plate 225. The reflected light may then pass through the relay lens unit 206; and arrive at the transparent beam-splitting plate 219. After being reflected at the fifth surface and the sixth surface of the transparent beam-splitting plate 219, the second transverse shearing interference fringes may be generated. The corresponding second transverse shearing interference fringes may be detected by the diffraction-based imaging unit 208 in the first measuring unit 221; and the second offset of the second grating 212 relative to the first optical axis 31 may be obtained. The absolute value of the difference between the first offset and the second offset may be used to determine whether there is an overlay offset along the first direction, and the specific value of the overlay offset by the first measuring unit 221.

Then, the first measuring unit 221 may rotate from the first position to the second position, while the second aperture 230 may continue to move. As a result, the second sub-overlay marker 227 along the second direction may be disposed in the viewing field of the optical system of the overlay measurement apparatus. The illuminating unit 218 may illuminate the third grating 223 of the second sub-overlay marker 227 along the second direction to generate third reflected light. The third reflected light generated from the third grating 223 may pass through the first imaging lens 226; and become the parallel third reflected light. The parallel third reflected light may pass through the first beam-splitting plate 224; and may be reflected on the third surface of the second beam-splitting plate 225. The reflected light may then pass through the relay lens unit 206; and arrive at the transparent beam-splitting plate 219. After being reflected at the fifth surface and the sixth surface of the transparent beam-splitting plate 219, the third transverse shearing interference fringes may be generated. The corresponding third transverse shearing interference fringes may be detected by the diffraction-based imaging unit 208 in the first measuring unit 221; and the third offset of the third grating relative to the first optical axis 31 may be obtained.

Then, the second aperture 230 in the illuminating unit 218 may continue to move. The illuminating unit 218 may illuminate the fourth grating 224 of the second sub-overlay marker 227 along the second direction to generate fourth reflected light. The fourth reflected light generated from the fourth grating 224 may pass through the first imaging lens 226; and may become the parallel fourth reflected light. The parallel fourth reflected light may pass through the first beam-splitting plate 224; and may be reflected on the third surface of the second beam-splitting plate 225. The reflected light may then pass through the relay lens unit 206; and may arrive at the transparent beam-splitting plate 219. After being reflected on the fifth surface and the sixth surface of the transparent beam-splitting plate 219, the fourth transverse shearing interference fringes may be generated. The corresponding fourth transverse shearing interference fringes may be detected by the diffraction-based imaging unit 208 in the first measuring unit 221. Thus, the fourth offset of the third grating 223 relative to the first optical axis 31 may be obtained. The absolute value of the difference between the third offset and the fourth offset may be used to determine whether there is an overlay offset along the second direction, and the specific value of the overly offset by the first measuring unit 221.

In one embodiment, when the absolute value of the difference between the first offset and the second offset is equal to, or smaller than approximately 1 nm, the overlay along the first direction may be determined as normal. When the absolute value of the difference between the first offset and the second offset is greater than approximately 1 nm, there may be an overlay offset along the first direction. The absolute value of the difference between the first offset and the second offset may be the exact value of the overlay offset along the first direction.

Similarly, when the absolute value of the difference between the third offset and the fourth offset is equal to, or smaller than approximately 1 nm, the overlay along the second direction may be determined as normal. When the absolute value of the difference between the third offset and the fourth offset is greater than approximately 1 nm, there may be an overlay offset along the second direction. The absolute value of the difference between the third offset and the fourth offset may be the exact value of the overlay offset along the second direction. In certain other embodiments, other absolute value of the difference may be used to determine whether there is an overlay offset.

Figure 13:
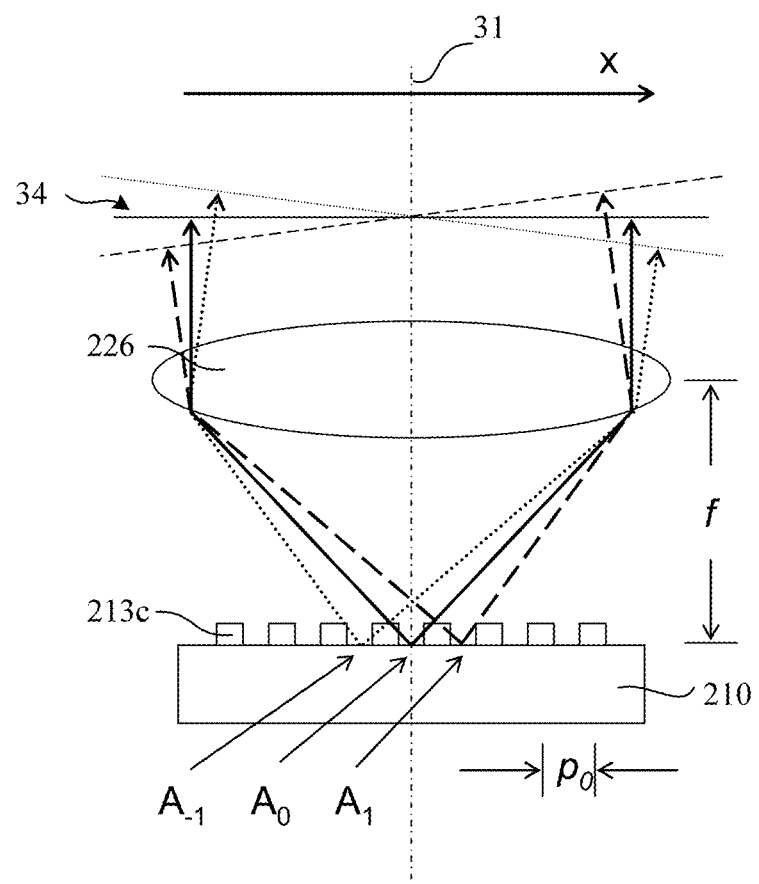
FIGS. 13-15 illustrate certain stages of an overlay measurement process using a first detection unit consistent with the disclosed embodiments.
Figure 14:
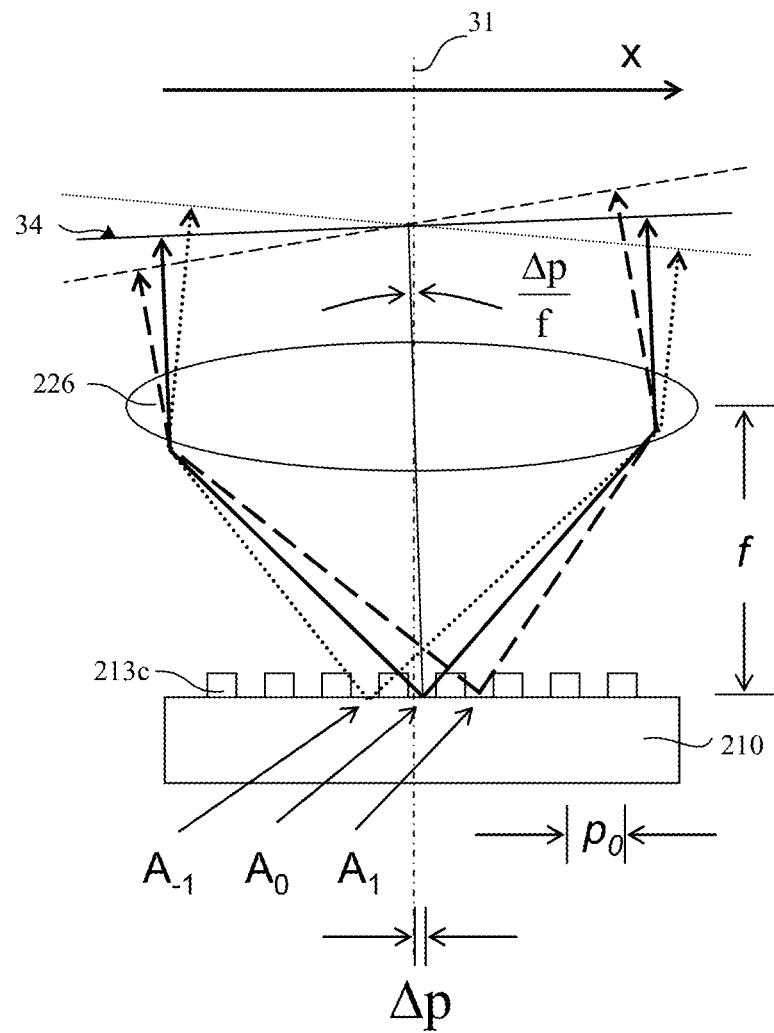
Figure 15:
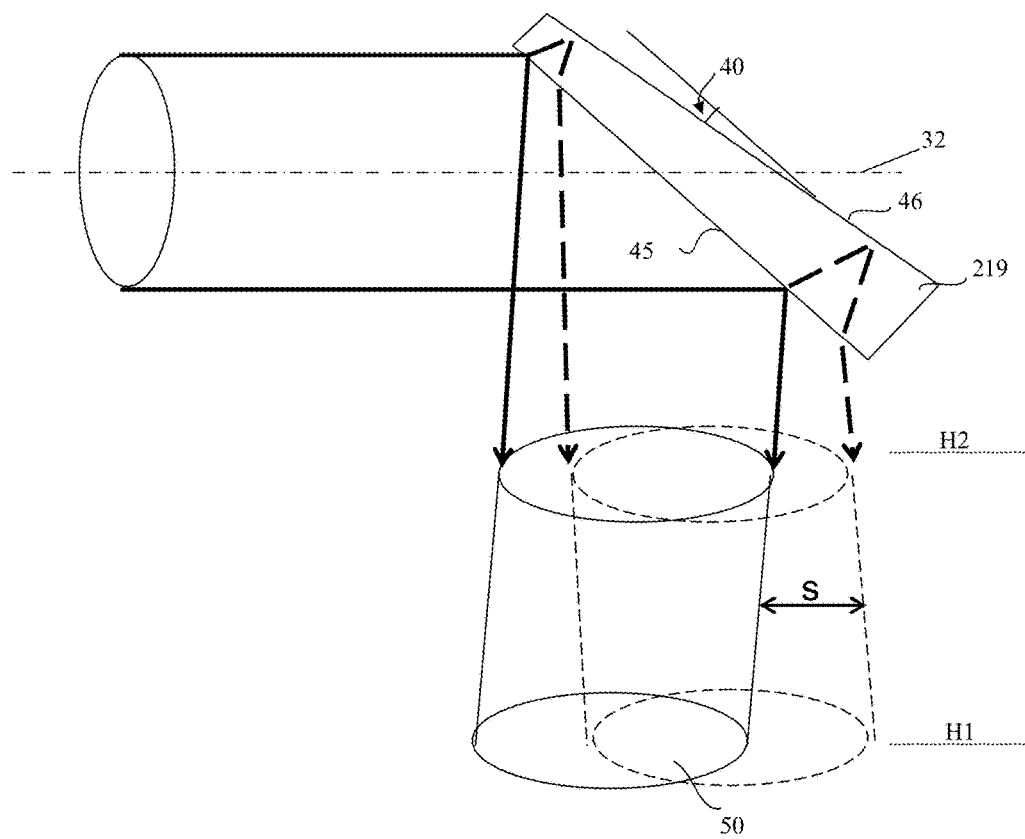

FIGS. 13-15 illustrate an exemplary mechanism to determine whether there is an overlay offset and the value of the overlay offset using the first measuring unit 213a. As illustrated in FIG. 13, after aligning the wafer 210 having the first overlay marker 213a with the overlay measurement apparatus, the horizontal position of the first overlay marker 213a (the first sub-overlay marker along the first direction or the second sub-overlay marker along the second direction) may be disposed on the focal plane of the first imaging lens 226. If there is no offset for the first overlay marker 213a relative to the first optical axis 31 (e.g. when the first optical axis 31 is intersected perpendicularly to the central axis of the first grating 211 or the second grating 212 of the first sub-overlay marker along the first direction), the illuminating unit 218 (referring to FIG. 1) may illuminate the first overlay marker 213a to genera reflected light. The reflected light from the gratings in the first overlay marker 213a (including the first grating 211 or the second grating 212, or the third grating 223 or the fourth grating 224) may be converged after transmitting through the first imaging lens 226; and may become parallel light on the back focal plane 34 (the pupil plane or the Fourier plane) of the first imaging lens 226. The light from the slit on the first optical axis 31 (such as the slit $A_0$ in FIG. 13, more specifically, the corresponding slit in the first grating, the second grating, the third grating or the fourth grating) may become parallel light in parallel to the first optical axis 31 on the back focal plane of the first imaging lens 226. The light from the slit away from the first optical axis 31 (such as the slit $A_{-1}$ and the slit $A_1$ illustrated in FIG. 13) may become the parallel light with a certain tilted angle on the back focal plane of the first imaging lens 226. The tilted angle=$p_0/f$. $p_0$ is the grating period (e.g., a center-to-center distance between adjacent grating stripes) of the first grating or the second grating, or the grating period of the third grating or the fourth grating; and f is the focal length of the first imaging lens 226.

In one embodiment, for illustrative purposes, the light from the slit $A_0$, the slit $A_{-1}$ and the slit $A_1$ may be used as an example to explain the mechanism for determining the overlay offset. When there is no offset, based on the Geometrical Optics, the amplitudes of the light from the slits may be A0, A−1 and A1 may be presented as in equations (1)-(3):

$$A_0 = a_0 \tag{1}$$

$$A_{-1} = a_0 \cdot e^{-i\left(\frac{2\pi x}{\lambda f} p_0\right)} \tag{2}$$

$$A_1 = a_0 \cdot e^{i\left(\frac{2\pi x}{\lambda f} p_0\right)} \tag{3}$$

Where $a_0$ is a constant; f is the focal length of the first imaging lens 226; $\lambda$ is the wavelength of the illuminating light; $p_0$ is the grating period of the first grating or the second grating (or the grating period of the third grating or the fourth grating); and x is the location of the light intensity or phase on the back focal plane 34 (the pupil plane or the Fourier plane).

If there is a certain offset ($\Delta p$) for the gratings (the first grating, the second grating, the third grating or the fourth grating) of the first overlay marker 213a relative to the first optical axis 31 along the lateral direction, as illustrated in FIG. 14, based on the Geometrical Optics, all the light beams on the back focal plane of the first imaging lens 226 may have a rotation $\Delta p/f$. Under such a condition, the amplitudes of the light from the slit $A_0$, the slit $A_{-1}$ and the slit $A_1$ may be $A_0$, $A_{-1}$ and $A_1$; and may presented as in equations (4)-(6):

$$A_0 = a_0 \cdot e^{i\left(\frac{2\pi x}{\lambda f} \Delta p\right)} \tag{4}$$

$$A_{-1} = a_0 \cdot e^{-i\left(\frac{2\pi x}{\lambda f}(p_0 - \Delta p)\right)} \tag{5}$$

$$A_1 = a_0 \cdot e^{i\left(\frac{2\pi x}{\lambda f}(p_0 + \Delta p)\right)} \tag{6}$$

Such equations only illustrate the calculation for the amplitudes of the light from the three slits $A_0$, $A_{-1}$ and $A_1$, equations for more slits may be referred to equations (7) and (8):

$$A_{-n} = a_0 \cdot e^{-i\left(\frac{2\pi x}{\lambda f}(np_0 - \Delta p)\right)} \quad (7)$$

$$A_n = a_0 \cdot e^{i\left(\frac{2\pi x}{\lambda f}(np_0 + \Delta p)\right)} \quad (8)$$

Where n is the nth slit of the first grating, the second grating, the third grating or the fourth grating; and n is greater than 1.

The distribution of the amplitudes of the light from all the slits of the first grating, the second grating, the third grating or the fourth grating on the back focal plane (the pupil plane or the Fourier plane) of the first imaging lens 226 is shown in equation (9):

$$A = A_0 + \sum_{n=1}^{N}(A_{-n} + A_n) = a_0 e^{i\left(\frac{2\pi x}{\lambda f}\Delta p\right)} \cdot \left[1 + \sum_{n=1}^{N} 2\cos\left(\frac{2\pi x}{\lambda f} np_0\right)\right] \quad (9)$$

Where N is the maximum number of slits on both sides of the asymmetrical axis of the first grating, the second grating, the third grating, or the fourth grating. For example, when N=5, the total number of slits=2N+1=11.

As illustrated in FIG. 15, in one embodiment, the first measuring unit 221 may include a transparent beam-splitting plate 219. The transparent beam-splitting plate 219 may include the fifth surface 45 and a sixth surface 46 opposing the fifth surface 45. There may be a wedged angle 40 between the fifth surface 45 and the sixth surface 46. In one embodiment, the wedged angle 40 may be in a range of approximately 1°-5°. During the overlay measurement with the first measuring unit 221, the reflected light from the first overlay marker 213a may pass through the second beam-splitting plate 225 (referring to FIG. 1) and the relay lens 206 (referring to FIG. 1); and may be reflected on the fifth surface 45 and the sixth surface 46 of the transparent beam-splitting plate 219 with the wedged angle. The light may then be separated into two light waves with the same amplitude and with a shift of some distance "s" in the space. After a superposition (or interference), the two light waves may form an intersection region 50. The intersection region 50 may correspond to the first transverse shearing interference fringes, the second transverse shearing interference fringes, the third transverse shearing interference fringes, or the fourth transverse shearing interference fringes. The light intensity of the intersection region 50 may be determined by the interferometer imaging unit 220 (referring to FIG. 1) by detecting the corresponding first transverse shearing interference fringes, the corresponding second transverse shearing interference fringes, the corresponding third transverse shearing interference fringes, or the corresponding fourth transverse shearing interference fringes.

After transmitting through the structure illustrated in FIG. 15, the amplitude of the light after lateral shifting and shearing interference (the shearing displacement is s) may be obtained from equation (10):

$$A_{composit}(s) = \quad (10)$$
$$A(s) + A(s=0) = \frac{1}{2}\left\{b_0 e^{i\left(\frac{2\pi(x+s)}{\lambda f}\Delta p\right)} \cdot \left[1 + \sum_{n=1}^{N} 2\cos\left(\frac{2\pi(x+s)}{\lambda f} np_0\right)\right] + b_0 e^{i\left(\frac{2\pi x}{\lambda f}\Delta p\right)} \cdot \left[1 + \sum_{n=1}^{N} 2\cos\left(\frac{2\pi x}{\lambda f} np_0\right)\right]\right\}$$

Where $b_0$ is a constant; and s is the shearing displacement.

To simplify the illustration, in one embodiment, the special location $$\left(x = \frac{\lambda f}{p_0}\right)$$

of a slit on the back focal plane may be used as the observation point for the light intensity to obtain the light intensity distribution (I). The light intensity distribution may be obtained from equation (11):

$$I(s) = A^*_{composite}(s) \cdot A_{composite}(s) = \quad (11)$$
$$b_0^2 \left\{\frac{1}{4}\left[1 + \sum_{n=1}^{N} \cos\left(\frac{2\pi s}{\lambda f} np_0\right)\right]^2 + \left(N + \frac{1}{2}\right)^2 + \left(N + \frac{1}{2}\right) \cdot \left[1 + \sum_{n=1}^{N} \cos\left(\frac{2\pi s}{\lambda f} np_0\right)\right] \cdot \cos\left(\frac{2\pi s}{\lambda f}\Delta p\right)\right\}$$

According to Equation (11), in one embodiment, the relationships between the overlay offset and the light intensity after the transverse shearing, the number of slits in the first overlay marker and the period, the wavelength of the illuminating light, the focal length of the first imaging lens, and the amount of shearing may be established based on the transverse shear principle. Because the slit number N, the wavelength of the illuminating light k, the focal length of the first imaging lens f, the period $p_0$ of the first grating, the second grating, the third grating or the fourth grating, and the amount of shearing may be known, with the measurement of the light intensity (I) of the corresponding first transverse shearing interference fringes, the corresponding second transverse shearing interference fringes, the corresponding third transverse shearing interference fringes, or the corresponding fourth transverse shearing interference fringes in the intersection region 50 (through the interferometer imaging unit 220), the first measuring unit 221 may calculate the value of the offset $\Delta p$, including the first offset of the first grating of the first sub-overlay marker along the first direction relative to the first optical axis, the second offset of the second grating of the first sub-overlay marker along the first direction relative to the first optical axis, the third offset of the third grating of the second sub-overlay marker along the second direction relative to the second optical axis and the fourth offset of the fourth grating of the second sub-overlay marker along the second direction relative to the first optical axis. The absolute value of the difference between the first offset and the second offset may be used to determine whether there is an overlay offset along the first direction and the specific value of the overlay offset by the first measuring unit 221. The absolute value of the difference between the third offset and the fourth offset may be used to determine whether there is an overlay offset along the second direction and the specific value of the overlay offset by the first measuring unit 221. In certain other embodiments, other locations on the back focal plane may be used as the observation point for the light intensity.

Further, as illustrated in FIG. 15, in certain other embodiments, to improve the measurement precision, the measuring height of the interferometer imaging unit 220 may be adjusted to obtain the light intensity corresponding to different shearing value. The corresponding first offset, the corresponding second offset, the corresponding third offset and the corresponding fourth offset may be obtained according to equation (11). For example, to determine the first offset of the first grating of the first sub-overlay marker along the first direction relative to the first optical axis 31, the interferometer imaging unit 220 of the first measuring unit 221 (shown in FIG. 1) may be first disposed at a first measuring height H1 with a corresponding shearing value as $s_1$. The light intensity $I_1$ corresponding to the first transverse shearing interference fringes may be obtained from the interferometer imaging unit 220 at the first measuring height H1. Then, the interferometer imaging unit 220 may be driven by the third driving unit to a second measuring height H2 different from the first measuring height H1. The corresponding shearing value may be $s_2$. The light intensity $I_2$ corresponding to the first transverse shearing interference fringes may be obtained from the interferometer imaging unit 220 at the second measuring height H2. By inserting $s_1$ and $I_1$, or $s_2$ and $I_2$, the first offset may be obtained according to equation (11). The second offset, the third offset and the fourth offset may be obtained in the similar way.

To illustrate the relatively high precision of the present overlay measurement apparatus, equation (11) may be simplified to equation (12) if there is only one slit:

$$I(s) = A^*_{composite}(s) \cdot A_{composite}(s) = \frac{1}{2} b_0^2 \left\{ 1 + \cos\left(\frac{2\pi s}{\lambda f} \Delta p\right) \right\} \quad (12)$$

When the first imaging lens 226 is a regular objective lens of a microscope, in one embodiment, the focal length of the imaging lens 226 f=2 mm; the numerical aperture (NA)=0.8; the width of the back focal plane=2f×tan ($\sin^{-1}$ NA)=2×2 mm×tan ($\sin^{-1}$ 0.8)=5.3 mm. If the maximum variable range of the shearing value s is one half of the width of the back focal plane, i.e., 2.65 mm; the light is green light with a wavelength of 500 nm, the change of argument of Cosine function is:

$$\frac{2\pi s}{\lambda f} \Delta p = \frac{6.28 \times 2.65 \text{ mm}}{500 \text{ nm} \times 2 \text{ mm}} \Delta p = 0.0166 \, \Delta p/\text{nm} \quad (13)$$

In equation (13), if the offset (or overlay offset) Δp=1 nm, the change of argument is 0.0166. According to Equation (12), the relative change of the light intensity with background deduction is 0.00014. Conventional cooling CCD image sensor may reach 16 bits per pixel dynamic range, i.e., 0-50000, a relative change of 0.00014 may be equivalent to 7/50000. Due to the random fluctuation, the worst fluctuation of the dynamic range of 50000 may be $(50000)^{0.5}$, i.e., 223/50000. Because the detection method is not an imaging method, a plurality of pixels may be multiplied. If 10000 pixels are used, the random fluctuation of the dynamic range may be reduced to 2.23/50000. Such a random fluctuation may be able to match the requirements for seven quanta detection. The sensitivity of the system may be further improved by averaging multiple exposures.

Further, referring to FIG. 1, in one embodiment, the structure of the second overlay marker 213b may be identical to the structure of the first overlay marker 213a. During the overlay measurement, the process to determine whether there is an overlay offset by the second measuring unit 203 may include the following exemplary steps.

The illuminating unit 218 may illuminate the second overlay marker 213b on the wafer 210; and the reflected light may be generated on the second overlay marker 213b. The reflected light may form parallel light after transmitting through the first imaging lens 226. The reflected light may then pass through the first beam-splitting plate 224 and the second beam-splitting plate 225; and may be received by the image-based imaging unit 201 to generate a second image after being focused by the second imaging lens 202 of the second measuring unit 203. The second image may be the real image of the first grating and the second grating (or the real image of the third grating and the fourth grating). Whether there is an overlay offset along the first direction may be determined by checking the difference between the central positions of the real image of the first grating and the corresponding real image of the second grating by the second measuring unit 203. In a similar way, whether there is an overlay offset along the second direction may be determined by checking the difference between the central positions of the real image of the third grating and the corresponding real image of the fourth grating. The determination criteria may be set according to the practical process. In one embodiment, when the difference between the central positions of the real image of the first grating and the corresponding real image of the second grating is greater than approximately 1 nm, there may be an overlay offset along the first direction. If the difference is equal to or smaller than approximately 1 nm, the overlay along the first direction may be determined as normal. Similarly, when the difference between the central positions of the real image of the third grating and the corresponding real image of the fourth grating is greater than approximately 1 nm, there may be an overlay offset along the second direction. If the difference is equal to, or smaller than approximately 1 nm, the overlay along the second direction may be determined as normal.

Figure 9:
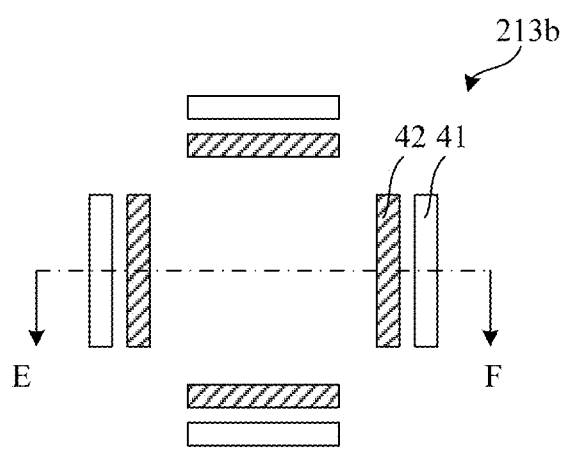
Figure 10:
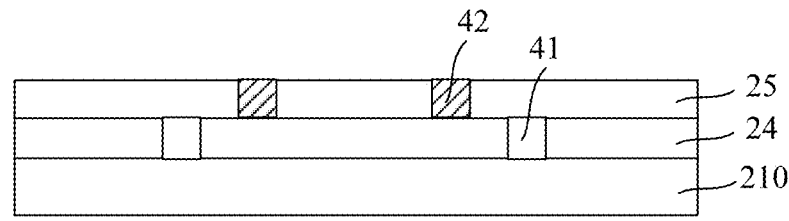

In certain other embodiments, the structure of the second overlay marker 231b may be different from that of the first overlay marker 213a. The detailed structures are illustrated in FIGS. 9-10. FIG. 10 is the cross-sectional view of the structure illustrated in FIG. 9 along the line "EF". The second overlay marker 213b may include the first image 41 disposed in the bottom dielectric layer and the second pattern 42 disposed in the top dielectric layer. The top dielectric layer may be formed on the surface of the bottom dielectric layer; and the first pattern 41 may be disposed outside of the second pattern 42 (or the projection of the second pattern 42 in the bottom dielectric layer).

In one embodiment, the second overlay marker 213b may include the first pattern 41 disposed in the first dielectric layer 24, and the second pattern 42 disposed in the second dielectric layer 25. The second dielectric layer 25 may be formed on top of the first dielectric layer. The first pattern 41 may include four first sub-patterns distributed in a shape of square. The second pattern 42 may include four second sub-patterns distributed in a shape of square. Each of the first sub-patterns may be disposed outside of the corresponding second sub-pattern.

The overlay measurement of the second overlay marker 213b illustrated in FIG. 9 by the second measuring unit 203 may include the following steps. The illuminating unit 218 may illuminate the second overlay marker 213b formed on the wafer 210; and the reflected light may be generated on the second overlay marker 213b. The reflected light may form parallel light after transmitting through the first imaging lens 226. The reflected light may then pass through the first beam-splitting plate 224 and the second beam-splitting plate 225; and may be received by the image-based imaging unit 201 to generate the second image after being focused by the second imaging lens 202 of the second measuring unit 203. The second image may be the real image of the first grating and the second grating. Whether there is an overlay offset along the first direction may be determined by checking the difference of the central positions of the real image of the first grating and the corresponding real image of the second grating by the second measuring unit 203.

Figure 11:
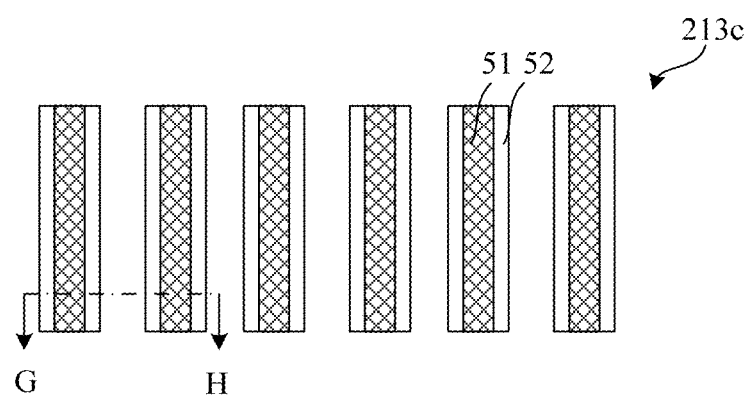
Figure 12:
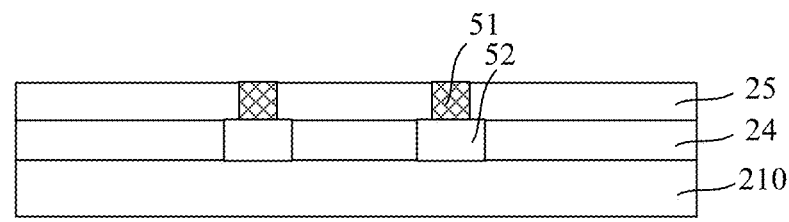

The detailed structure of the third overlay marker 213c is illustrated in FIGS. 11-12. FIG. 12 is the cross-sectional view of the structure illustrated in FIG. 11 along the line "GH".

The third overlay marker 213c may include the fifth grating 52 disposed in the bottom dielectric layer 24, and the sixth grating 51 disposed in the top dielectric layer 25. The top dielectric layer 25 may be formed on the surface of the bottom dielectric layer 24; and the sixth grating 51 may be formed right on top of the fifth grating 52. The fifth grating 52 may include a plurality of grating fringes disposed in parallel. The sixth grating 51 may include a plurality of grating fringes disposed in parallel. Each sixth grating fringe may be disposed right on the top of the corresponding fifth grating fringe; and the width of the sixth grating fringes may be smaller than that of the fifth grating fringes.

During the overlay measurement of the third overlay marker 213c illustrated in FIG. 11, the illuminating unit 218 may illuminate the third overlay marker 213c; and diffracted light may be generated. The diffracted light may be received by the third measuring unit 209 to form a third image. If there is a position offset for the fifth grating 52 and the six grating 51 in the third overlay marker 213c (the central position of the fifth grating 52 does not match the center position of the sixth grating 51), the light intensity between the positive and the negative diffraction orders of the positive and the negative light generated from the third overlay marker 213c may be different. Such a difference may be used to determine whether there is an overlay offset by the third measuring unit 209. If there is a difference, there may be an overlay offset. If there is no difference, there may be no overlay offset.

In one embodiment, the third overlay marker 213c may be formed on the wafer 210 with different distribution directions, such as a first direction and a different second direction, etc. The fifth grating 52 and the sixth grating 51 of the third overlay marker 213c may be both distributed along the first direction. The fifth grating 52 and the sixth grating 51 of the third overlay marker 213c may be both distributed along the second direction. Whether there is an overlay offset along the first direction may be determined through the third overlay marker 213c along the first direction by the third measuring unit 209. Whether there is overlay an offset along the second direction may be determined through the third overlay marker 213c along the second direction by the third measuring unit 209.

Thus, according to the disclosed embodiments, the present disclosed overlay measurement apparatus may include a first measuring unit. The reflected light from the first overlay marker may be received by the first measuring unit to generate lateral shearing interference to form the interference light. The first measuring unit may also receive the interference light to form a first image; determine the existence of the overlay measurement; and obtain the specific value of the overlay offset. Based on the theory of the transverse shearing, the relationships among the overlay offset and the light intensity after the transverse shearing, the number of slits in the first overlay marker, the grating period, the wavelength of the illuminating light, the focal length of the first imaging lens, and the shearing value may be established by the overlay measurement apparatus. Since the number of slits, the grating period, the wavelength of the illuminating light, the focal length of the first imaging lens and the shearing value may be known for the first overlay marker, during the overlay measurement, the overlay offset may be obtained if the light intensity after the transverse shearing could be obtained. Thus, whether there is an overlay offset, and the specific value of the offset may be precisely determined.

Moreover, the present disclosed overlay measurement apparatus may also include a first driving unit, which may be connected to the first measuring unit to drive the first measuring unit to rotate from a first position to a second position. The first measuring unit may thus measure the first sub-overlay marker along the first direction and the second sub-overlay marker along the second direction formed on the wafer. Thus, the overlay measurement along the two directions may be performed, and the practical application of the overlay measurement apparatus may be enhanced.

Further, the present disclosed overlay measurement apparatus may also include the second measuring unit and the third measuring unit. The overlay markers of different types may be measured by different methods. That is, the IBO method and DBO method may be combined in the overlay measurement apparatus. Therefore, the application field of the overlay measurement apparatus may be increased.

Further, the first overlay marker may include the first sub-overlay marker along the first direction, and the second sub-overlay marker along the second direction. The first sub-overlay marker along the first direction may include the first grating disposed on the bottom dielectric layer, and the second grating disposed on the top dielectric layer. The top dielectric layer may be located on the surface of the bottom dielectric layer; and the second grating may be located on the inclined top of the first grating. The second sub-overlay marker along the second direction may include the third grating disposed in the bottom dielectric layer, and the fourth grating disposed in the top dielectric layer. The fourth grating may be disposed on the inclined top of the third grating. By measuring the intensity of the corresponding light with the first measuring unit, the first offset of the first grating relative to the first optical axis may be obtained; as well as the second offset of the second grating relative to the first optical axis. The absolute value of the difference between the first offset and the second offset may be used to determine whether there is an overlay offset along the first direction and the specific value of the overlay offset by the first measuring unit. Similarly, by measuring the intensity of the corresponding light with the first measuring unit, the third offset of the third grating relative to the first optical axis may be obtained, as well as the fourth offset of the fourth grating relative to the first axis. The absolute value of the difference between the third offset and the fourth offset may be used to determine whether there is an overlay offset along the second direction, and the specific value of the overlay offset by the first measuring unit.

Further, the third overlay marker may include the fifth grating disposed in the bottom dielectric layer and the sixth grating disposed in the top dielectric layer. The top dielectric layer may be formed on the surface of the bottom dielectric layer; and the sixth grating may be disposed right on the top of the fifth grating. The fifth grating may include a plurality of fifth grating fringes disposed in parallel. The sixth grating may include a plurality of grating sixth fringes disposed in parallel. Each sixth grating fringe may be disposed right on top of the corresponding fifth grating fringe; and the width of the sixth grating fringe may be smaller than that of the fifth grating fringe. During the overlay measurement process, the illuminating unit may illuminate the third overlay marker with the fifth grating and the sixth grating, the positive and the negative diffracted light generated from the third overlay marker may be received by the third measuring unit. Thus, whether there is an offset may be determined by comparing the light intensity between the positive and the negative diffracted light.

Further, the illuminating unit may also include the second driving unit, the second aperture and the second condensing lens. The second aperture may be disposed between the first condensing lens and the first beam-splitting plate. The second aperture may restrict the size of the light beam after transmitting through the first condensing lens. The second condensing lens may converge the light after transmitting through the second aperture on the first surface of the first beam-splitting plate, and then focus it on the back focal plane of the first imaging lens. The second driving unit may be connected to the second aperture to drive the second aperture to move along a direction perpendicular to the third optical axis. Therefore, the incident direction of the light after transmitting through the second aperture may be changed. The illuminating unit, the first aperture, the beam expander lens, the first condensing lens and the second condensing lens may be immovable; and the second aperture may move up and down along the direction parallel to the first optical axis driven by the second driving unit. During the measurement of the first overlay marker or the third overlay marker, with the move of the second aperture, the illuminating unit may illuminate the first grating and the second grating of the first overlay marker and the third overlay marker sequentially without moving the wafer. Therefore, the error due to the movement of the wafer may be minimized; and the accuracy of the overlay measurement may be improved.

Further, the first measuring unit may also include the third driving unit. The third driving unit may be connected to the interferometer imaging unit to drive the interferometer to be away from, or close to the fifth surface of the transparent beam-splitting plate. During the overlay measurement, the interferometer imaging unit may be at different measuring heights to obtain the light intensities corresponding to the different measuring heights. With relatively simple calculation, the first offset of the first grating of the first overlay marker relative to the first optical axis, the second offset of the second grating relative to the first optical axis, the third offset of the third grating relative to the first optical axis and the fourth offset of the fourth grating relative to the first optical axis may be determined. Accordingly, the overlay offset along the first direction and the second direction may be measured.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An overlay measurement apparatus, comprising:
    an illuminator, configured to generate light to illuminate a first overlay marker on a wafer having a first sub-overlay marker along a first direction and a second sub-overlay marker along a second direction perpendicular to the first direction to generate reflected light;
    a first measuring imager, configured to receive the reflected light from the first overlay marker to cause the reflected light to laterally shift and shear to generate interference light, to receive the interference light to form a first image, and to determine existence and values of overlay offsets along the first direction and the second direction according to the first image; and
    a first drive rotator connected to the first measuring imager, and configured to drive the first measuring imager to rotate from a first position to a second position to measure the first sub-overlay marker along the first direction and the second sub-overlay marker along the second direction, respectively.

2. The overlay measurement apparatus according to claim 1, further comprising:
    a second measuring imager configured, after the illuminator illuminating a second overlay marker formed on the wafer to generate second reflected light, to receive the second reflected light to form a second image, and to determine existence of an overlay offset according to the second image; and
    a third measuring imager configured, after the illuminator illuminating a third overlay marker formed on the wafer to generate positive and negative diffracted light, to receive the positive and negative diffracted light to form a third image, and determine existence of an overlay offset according to the third image.

3. The overlay measurement apparatus according to claim 1, further comprising:
    a first optical axis;
    a second optical axis perpendicular to the first optical axis;
    a third optical axis perpendicular to the first optical axis;
    a first imaging lens;
    a first beam-splitting plate having a first surface and a second surface and disposed on the first optical axis; and
    a second beam-splitting plate having a third face and a fourth face and disposed on an intersection point of the first optical axis and the second optical axis,
    wherein:
    an angle between the first optical axis and the first beam-splitting plate is approximately 45°;
    an angle between the second beam-splitting plate and an extension line of the first beam-splitting plate is approximately 90°; and
    the third surface of the second beam-splitting plate faces the second surface of the first beam-splitting plate.

4. The overlay measurement apparatus according to claim 3, wherein:
    the second measuring imager is disposed on the first optical axis at a side of the fourth surface of the second beam-splitting plate; and a portion of the reflected light is received by the second measuring imager after transmitting through the first beam-splitting plate and the second beam-splitting plate.

5. The overlay measurement apparatus according to claim 4, wherein the second measuring imager comprises:
an image-based imaging device and
a second imaging lens,
wherein:
the second imaging lens is disposed on the first optical axis at a side of the fourth surface of the second beam-splitting plate;
the image-based imaging device is disposed on the first optical axis at a side of the second imaging lens far away from the second beam-splitting plate; and
the second imaging lens converges a portion of the reflected light transmitting through the second beam-splitting plate on the image-based image device to form the second image and determine existence of an overly offset.

6. The overlay measurement apparatus according to claim 3, wherein:
the third measuring imager is disposed on the third optical axis at a side of the third surface of the second beam-splitting; and
a portion of the positive and negative diffracted light is received by the third measuring imager after transmitting through the first beam-splitting plate and being reflected by the third surface of the second beam-splitting plate.

7. The overlay measurement apparatus according to claim 6, further comprising:
a relay lens combo disposed on the second optical axis between the third measuring imager and the second beam-splitting plate,
wherein:
the relay lens combo comprises a first relay lens and a second relay lens; and
a distance between the first relay lens and the second beam-splitting plate is smaller than a distance between the second relay lens and the second beam-splitting plate.

8. The overlay measurement apparatus according to claim 7, wherein the third measuring imager comprises:
a third imaging lens; and
a diffraction-based imaging device,
wherein:
the third imaging lens is disposed on the second optical axis at a side of the relay lens device far away from the second beam-splitting plate;
the diffraction-based imaging device is disposed on the second optical axis at a side of the third imaging lens far away from the second beam-splitting plate;
the third imaging lens converges a portion of the diffracted light transmitting through the relay lens combo on the diffraction-based imaging device; and
the diffraction-based imaging device receives a portion of the diffracted light converged by the third imaging device to form the third image, and determine existence of an overlay offset according to the third image.

9. The overlay measurement apparatus according to claim 8, wherein:
the first measuring imager is disposed between the first relay lens and the third measuring imager;
the first measuring imager includes a transparent beam-splitting plate and an interferometer imaging device;

the transparent beam-splitting plate is disposed on the second optical axis between the relay lens combo and the third measuring imager;
the transparent beam-splitting plate includes a fifth surface and a sixth surface;
the fifth surface of the second beam-splitting plate faces the third surface of the second beam-splitting plate;
an angle between the transparent beam-splitting plate and an extension line of the second beam-splitting plate is approximately 90°; and
the interferometer imaging device is disposed under the fifth surface of the transparent beam-splitting plate.

10. The overlay measurement apparatus according to claim 9, wherein the first measuring imager further comprises:
a third drive rotator connected to the interferometer imaging device, and configured to drive the interferometer imaging device to move away or close to the fifth surface of the transparent beam-splitter.

11. The overlay measurement apparatus according to claim 9, wherein:
the fifth surface of the transparent beam-splitting plate and the sixth surface of the transparent beam-splitting plate have a wedged angle.

12. The overlay measurement apparatus according to claim 3, wherein:
the first beam-splitting plate is disposed at an intersection point of the first optical axis and the third optical axis;
the first imaging lens is disposed on the first optical axis under the first surface of the first beam splitting plate; and
light generated from the illuminator irradiates overlay markers after being reflected by the first surface of the first beam-splitting plate and the second surface of the first beam-splitting plate and transmitting through the first imaging lens.

13. The overlay measurement apparatus according to claim 12, wherein the illuminator comprises:
a light source configured to generate a point light source;
a beam expander lens configured to covert the point light to parallel light;
a first aperture configured to restrict the parallel light; and
a first condensing lens configured to covert light transmitting through the first aperture to parallel light,
wherein the light source, the beam expander lens, the first aperture and the first condensing lens are sequentially disposed on the third optical axis.

14. The overlay measurement apparatus according to claim 13, wherein the illuminator further comprises:
a second aperture disposed between the first condensing lens and the first beam-splitting plate, and configured to control beam size of the light transmitting through the first condensing lens;
a second condensing lens configured to focus light transmitting through the second aperture, and being converged on the first surface of the first beam-splitting plate on a back focal plane of the first imaging lens; and
a second drive rotator connected to the second aperture, and configured to drive the second aperture to move along a direction perpendicular to the second optical axis to change an incident direction of the light transmitting through the second aperture.

15. The overlay measurement apparatus according to claim 3, wherein:
the first overlay marker is a grating type of overlay marker.

16. An overlay measurement method, comprising:

disposing a first measuring imager at a first position;

illuminating a first grating of a first overlay marker on a wafer to generate first reflected light;

forming first lateral shearing interference fringes from the first reflected light;

obtaining a first offset of the first grating relative to a first optical axis according to the light intensity of the first lateral shearing interference fringes;

illuminating a second grating of the first overlay marker to generate second reflected light;

forming second lateral shearing interference fringes from the second reflected light;

obtaining a second offset of the second grating relative to the first optical axis according to the light intensity of the second lateral shearing interference fringes;

determining existence of an overlay offset and an exact value of the overlay offset along a first direction according to a difference between the first offset and the second offset;

moving the first measuring imager from the first position to a second position;

illuminating a third grating of the first overlay marker to generate third reflected light;

forming third lateral shearing interference fringes from the third reflected light;

obtaining a third offset of the third grating relative to the first optical axis according to the third lateral shearing interference fringes;

illuminating a fourth grating of the first overlay marker to generate fourth reflected light;

forming fourth lateral shearing interference fringes from the fourth reflected light;

obtaining a fourth offset of the fourth grating relative to the first optical axis according to the fourth lateral shearing interference fringes; and determining existence of an overlay offset and an exact value of the overlay offset along a second direction perpendicular to the first direction according to a difference between the third offset and the fourth offset.

17. The overlay measurement method according to claim 16, wherein:

the first measuring imager forms a first image including one of a first combination of the first lateral shearing interference fringes and the second interference fringes and a second combination of the third shearing interference fringes and the fourth shearing interference fringes;

the first overlay marker includes a first sub-overlay marker along the first direction and a second sub-overlay marker along the second direction;

the first sub-overlay marker includes the first grating and the second grating; and the second sub-overlay marker includes the third grating and the fourth grating.

18. The overlay measurement method according to claim 17, wherein:

the second grating is disposed on an inclined top of the first grating; and the fourth grating is disposed on an inclined top of the third grating.

19. The overlay measurement method according to claim 16, wherein moving the first measuring imager from the first position to the second position further comprises:

driving the first measuring imager to rotate for 90° from the first position to the second position along an optical axis.

\* \* \* \* \*